US010734081B1

(12) United States Patent
Blatt et al.

(10) Patent No.: US 10,734,081 B1
(45) Date of Patent: Aug. 4, 2020

(54) PULSE-AMPLITUDE MODULATION FOR A MULTIPLE DIE MEMORY DEVICE

(71) Applicant: SanDisk Technologies LLC, Addison, TX (US)

(72) Inventors: Nimrod Blatt, San Jose, CA (US); Gennady Burdo, San Jose, CA (US); Tal Hamias, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/453,184

(22) Filed: Jun. 26, 2019

(51) Int. Cl.
*G11C 16/06* (2006.01)
*G11C 16/26* (2006.01)
*G11C 7/10* (2006.01)
*G06F 3/06* (2006.01)

(52) U.S. Cl.
CPC ............ *G11C 16/26* (2013.01); *G06F 3/0688* (2013.01); *G11C 7/1063* (2013.01)

(58) Field of Classification Search
CPC ...... G11C 16/26; G11C 7/1063; G06F 3/0688
USPC ..................................................... 365/185.18
See application file for complete search history.

(56) References Cited

U.S. PATENT DOCUMENTS

2015/0199149 A1\* 7/2015 Sankaranarayanan ...................... G06F 3/0611
711/102

\* cited by examiner

*Primary Examiner* — Huan Hoang
(74) *Attorney, Agent, or Firm* — Dickinson Wright PLLC; Steven Hurles

(57) ABSTRACT

A method for implementing pulse-amplitude modulation on a memory device includes configuring a first resistor of a first memory die to a first resistance value. The method also includes configuring a second resistor of a second memory die to a second resistance value. The method also includes receiving, during performance of a read operation, in parallel: two voltage values from the first memory die; and two voltage values from the second memory die. The method also includes determining a first data bit value using the two voltage values from the first memory die. The method also includes determining a second data bit value using the two voltage values from the second memory die.

20 Claims, 7 Drawing Sheets

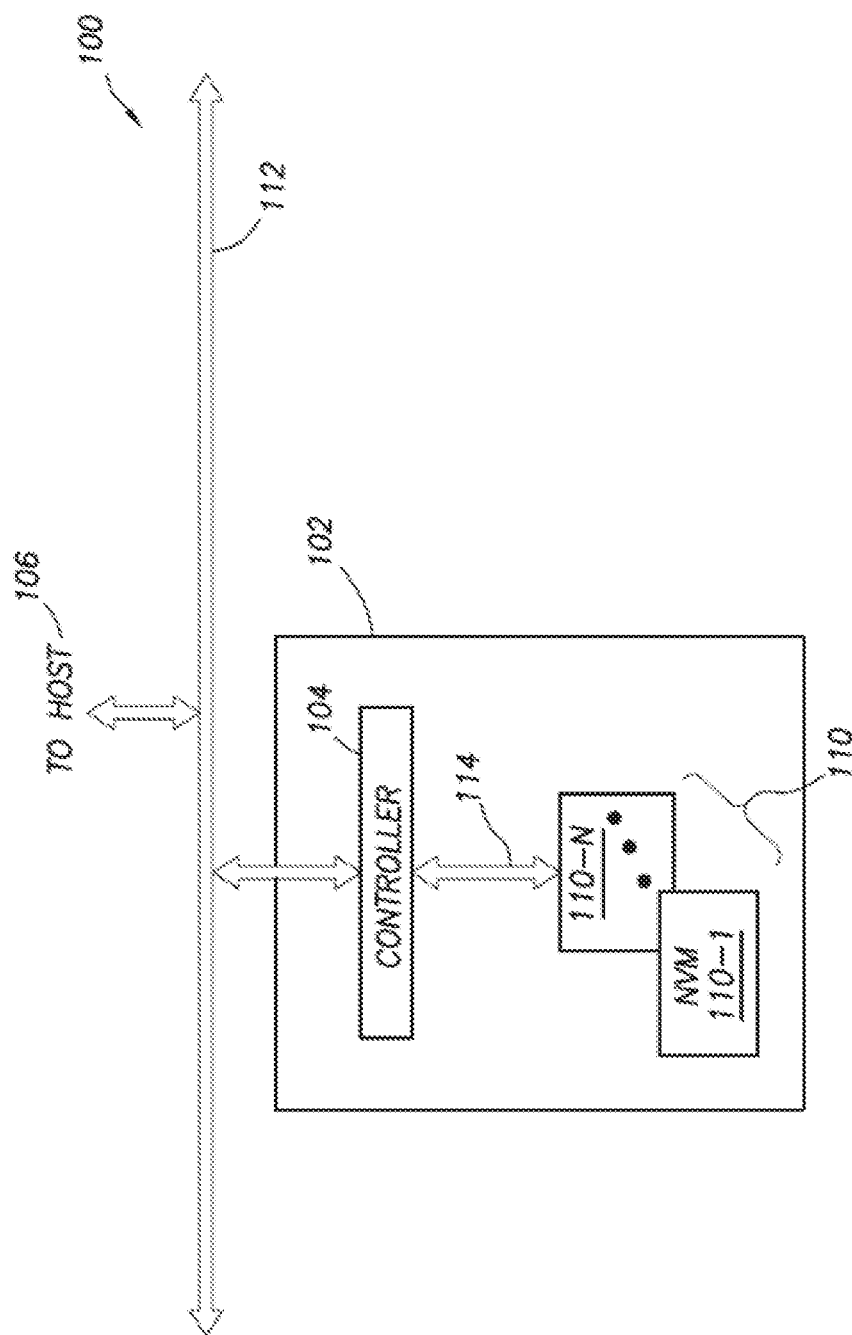

PULSE-AMPLITUDE MODULATION FOR A MULTIPLE DIE MEMORY DEVICE

TECHNICAL FIELD

This disclosure relates to memory systems and in particular to using pulse-amplitude modulation for a multiple memory die memory system.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

A typical memory system includes multiple memory dies that are connected in parallel. One measure of performance of such memory systems is read data transfer speed (e.g., the rate at which data can be read from memory cells of the memory system). Multiple memory dies connected in parallel may have relatively large parasitic capacitance, which may result signal integrity defects. Such signal integrity defects may limit toggle data transfer rate and may make increasing throughput (e.g., increasing the data transfer rate) difficult.

SUMMARY

This disclosure relates generally to memory management systems and methods.

An aspect of the disclosed embodiments is a method for implementing pulse-amplitude modulation on a memory device. The method includes configuring a first resistor of a first memory die to a first resistance value. The method also includes configuring a second resistor of a second memory die to a second resistance value. The method also includes receiving, during performance of a read operation, in parallel: two voltage values from the first memory die; and two voltage values from the second memory die. The method also includes determining a first data bit value using the two voltage values from the first memory die. The method also includes determining a second data bit value using the two voltage values from the second memory die.

Another aspect of the disclosed embodiments is a controller that includes a bus interface and a processor. The bus interface is in communication with one or more memory dies of a memory system. The processor is configured to: configure a first resistor of a first memory die to a first resistance value; configure a second resistor of a second memory die to a second resistance value; receive, during performance of a read operation, in parallel, two voltage values from the first memory die and two voltage values from the second memory die; determine a first data bit value using the two voltage values from the first memory die; and determine a second data bit value using the two voltage values from the second memory die.

Another aspect of the disclosed embodiments is a system for implementing pulse-amplitude modulation on a memory system. The system includes a plurality memory dies and a controller. The plurality of memory dies are shorted to a transmission line. The controller is in communication with the transmission line and configured to configure a resistor for each memory die of the plurality of memory dies to a respective resistance value. The controller includes at least one pulse-amplitude modulation receiver configured to: receive, during performance of a read operation, in parallel, two voltage values from each memory die of the plurality of memory dies; and determine a data bit value for each memory die of the plurality of memory dies using the two voltage values corresponding to each respective memory die.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1B generally illustrates a block diagram of an example non-volatile memory system according to the principles of the present disclosure.

DETAILED DESCRIPTION

Figure 1B:
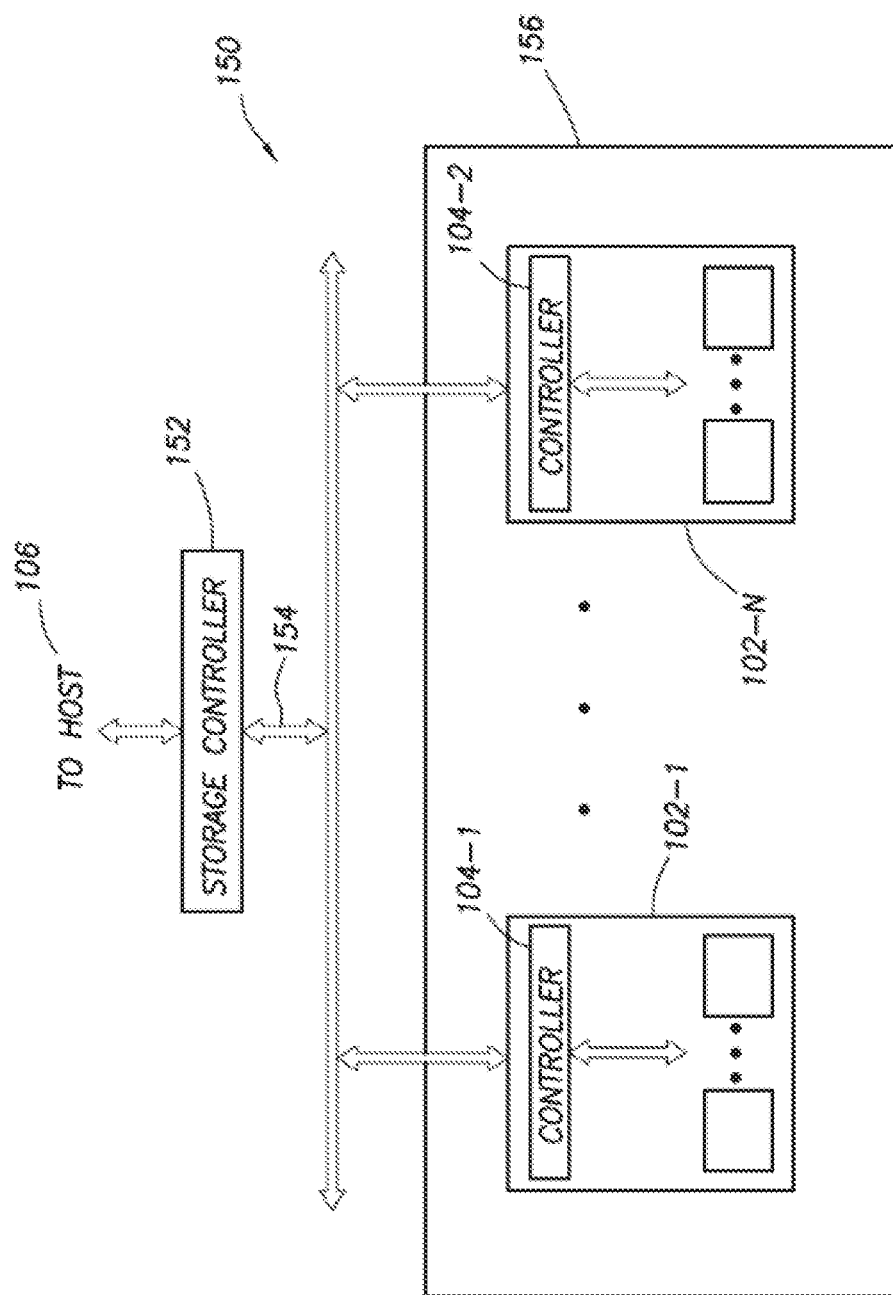

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

A typical serial communications memory system uses a binary non-return to zero (NRZ) communications format for reading or transferring data from memory cells of the memory system. The NRZ is a binary code in which ones are represented by one significant condition, usually a positive voltage, while zeros are represented by some other significant condition, usually a negative voltage, with no other neutral or rest condition. One measure of performance of such a memory system is read data transfer speed (e.g., the rate at which data can be read from memory cells of the memory system for sequential or random data, such as 4 kilobytes of data). However, as described the memory system may include multiple memory dies that are connected in parallel. Multiple memory dies connected in parallel may have relatively large parasitic capacitance, which may result signal integrity defects. Such signal integrity defects may limit toggle data transfer rate and may make increasing throughput (e.g., increasing the data transfer rate) difficult. Additionally, the NRZ communications format is limited to reading or transferring one bit from the memory cells during a clock cycle.

One mechanism for increasing throughput (e.g., thereby increasing data transfer rate) is to use a pulse-amplitude modulation (PAM) communications format for reading or transferring data from the memory cells. The PAM communications format includes signal modulation where the data from the memory cells is encoded in the amplitude of a series of signal pulses. PAM4 receives, in parallel, four voltage values during a read operation, where two voltage values correspond to one bit and the other two voltage values correspond to another bit. Accordingly, during one clock cycle, using PAM4, two bits are read or transferred from the memory cells, which doubles the data transfer rate. In addition to PAM4, PAM8 may be used to read four bits from the memory cells, PAM16 may be used to read eight bits from the memory cells, and so on.

In order to implement PAM (e.g., PAM4, PAM8, PAM16, and the like), memory systems typically include dedicated circuits using different transmit drier output resistors to distinguish between a '01' and '10' combinations of inputs (e.g., where '00' and '11' are typically more trivially separated). The result of such circuits is four (e.g., using PAM4) transmitted levels that distinguish among the four (e.g., two bits) states. Such systems are typically used in communication to multiply the utility and/or capacity of serial buses associated with the memory system on the expanse of higher resolution and sensitivity of the PAM receiver circuit. However, such circuits can add cost and may introduce delay. Further, such circuits are not typically implemented for memory systems having multiple memory dies.

Accordingly, systems and methods, such as the systems and methods described herein, configured to implement PAM communications format on a memory system having multiple memory dies thereby increasing throughput using the same or slower toggle data transfer rate, may be desirable. In some embodiments, the systems and methods described herein may be configured to configure driver resistors for memory dies that are connected in parallel to the same transmission line (e.g., connected at one end to the memory dies and at another end to a controller of the memory system) to different resistance values. In some embodiments, the systems and methods described herein are configured to receive, at the controller, two voltage values for each memory die connected to the transmission line. The controller may include a PAM receiver configured to distinguish between the voltage values from each of the memory dies and to determine data bits corresponding to each of the memory dies. For example, the PAM receive determines a first data bit using two voltage values from a first memory die, and so on. In some embodiments, the systems and methods described herein may be configured to synchronize each memory die connected to the transmission line, such that all data from the memory dies is transferred during the same clock phase.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the controller 104 may receive commands or instructions from the host 106 and may perform read operations, write operations, programming operations, erase operations, other suitable operations, or a combination thereof on the memory of the storage system 102 in response to the commands or instructions communicated by the host 106. The host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

FIG. 1B generally illustrates a block diagram of the system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
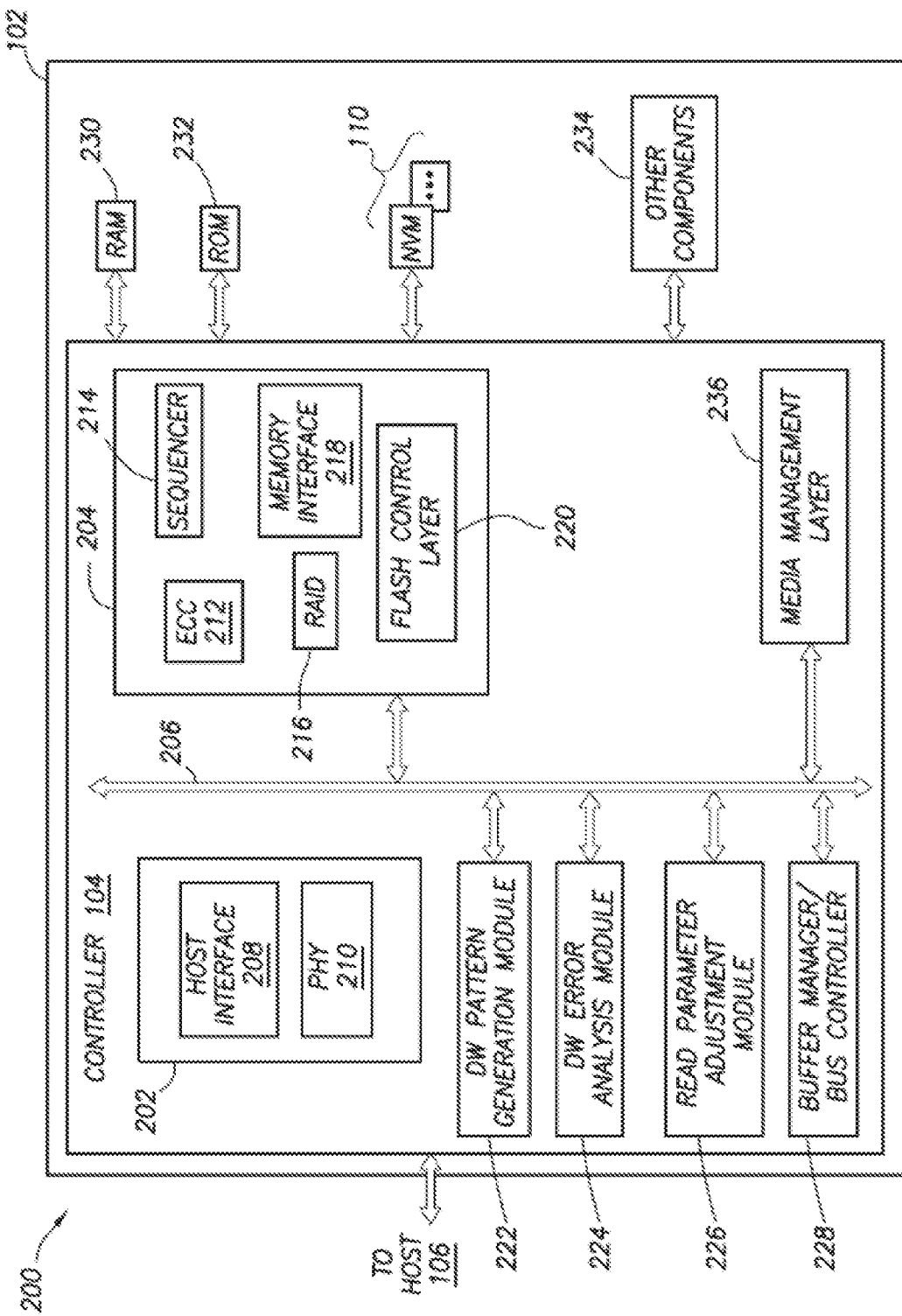
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
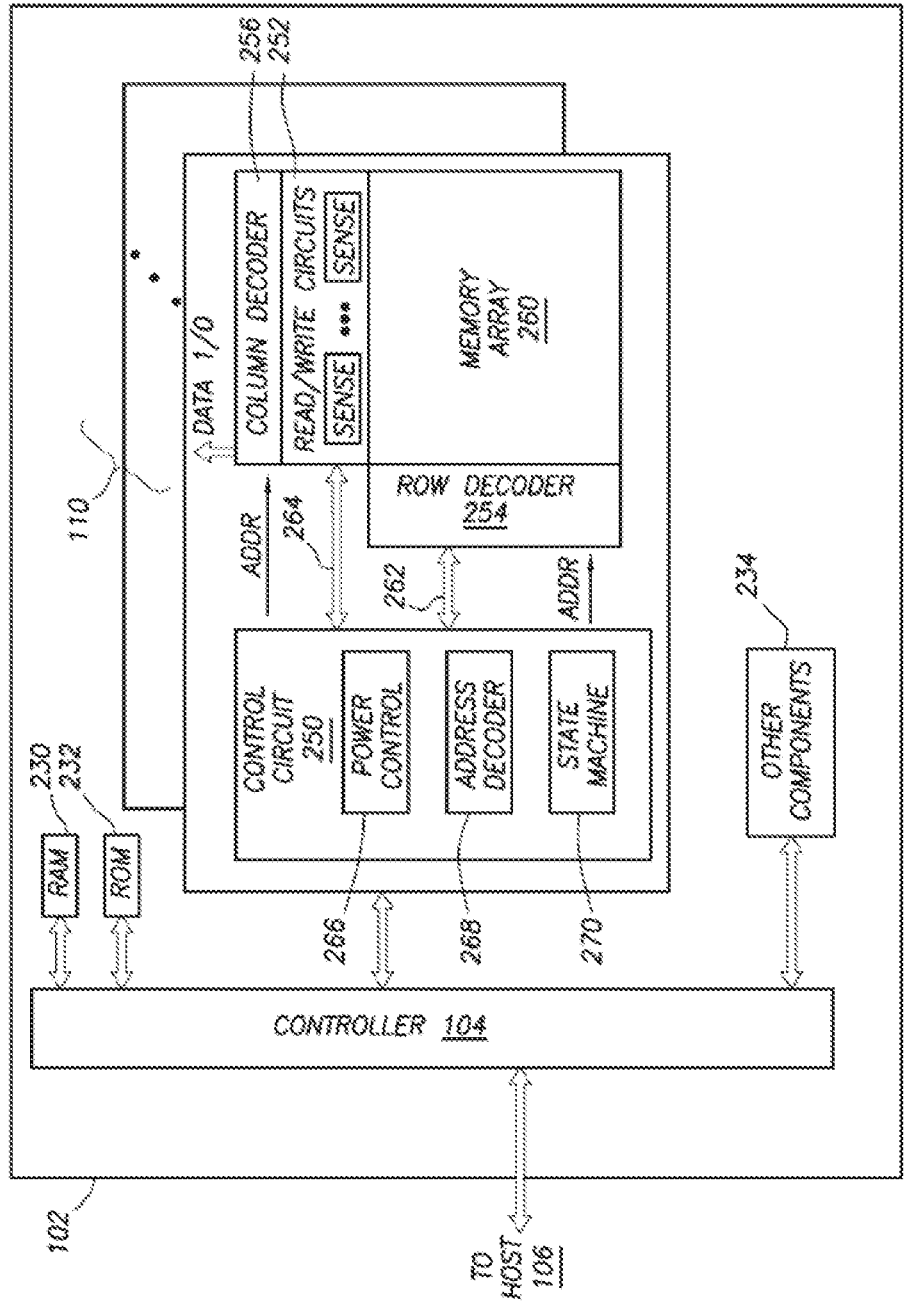
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
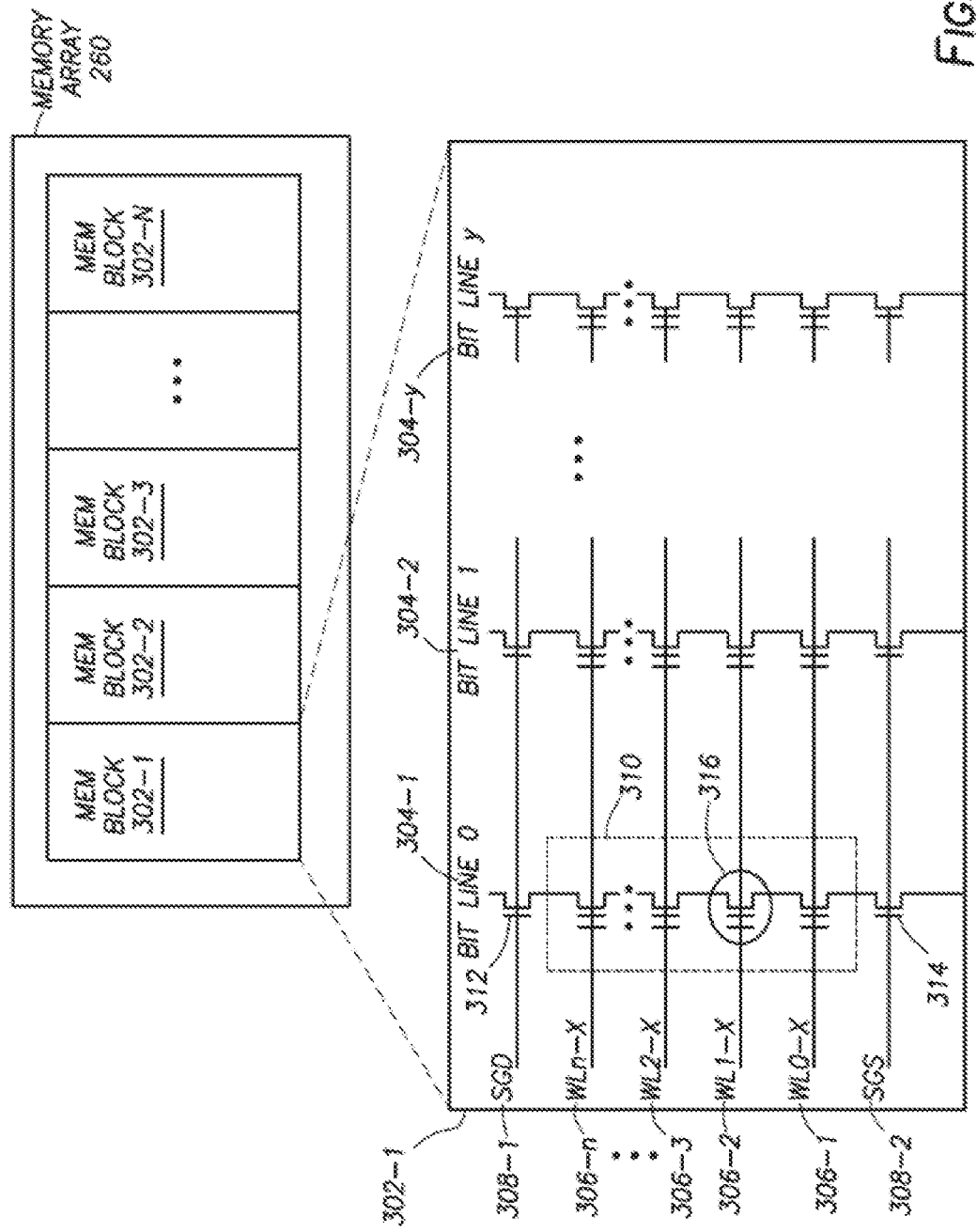
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

Figure 4:
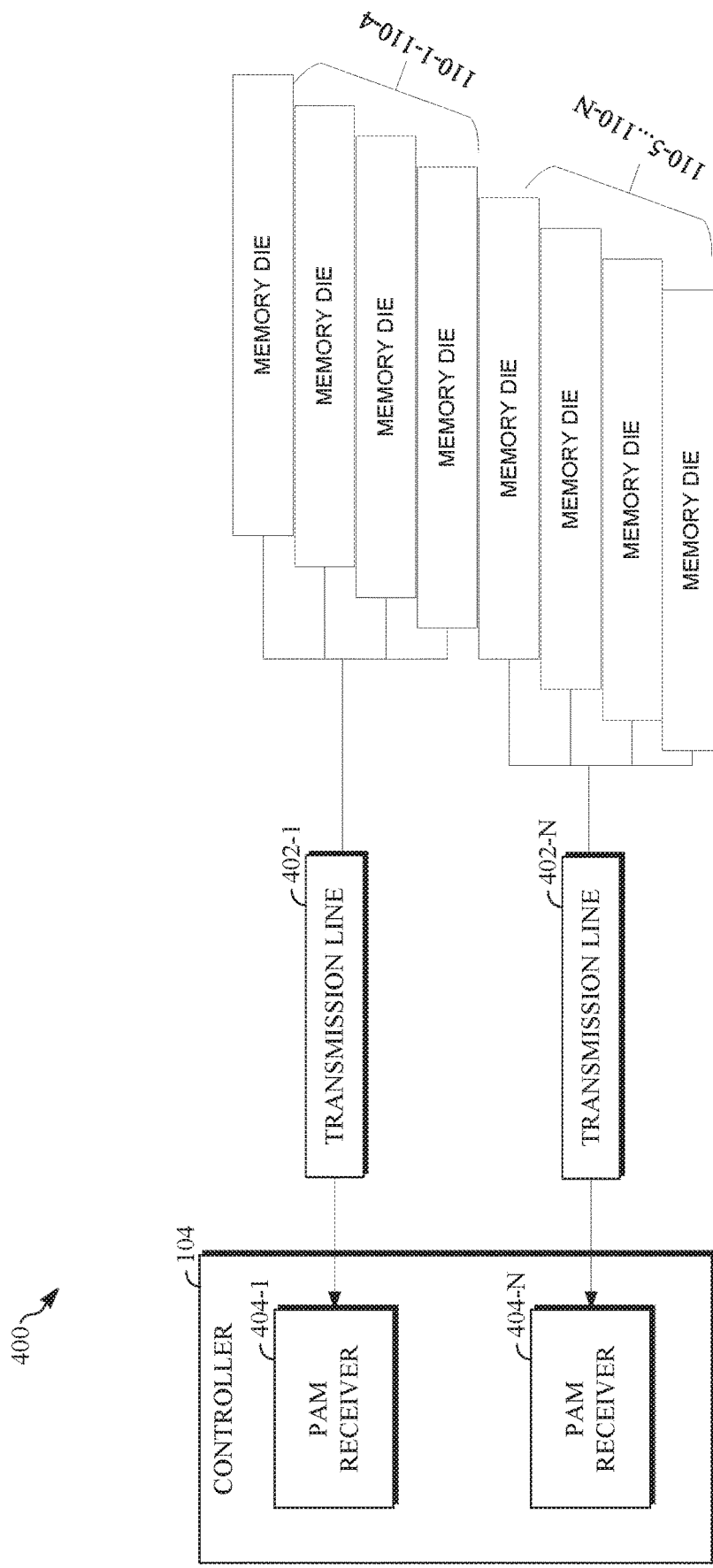
FIG. 4 generally illustrates a pulse-amplitude modulation implementation system according to the principles of the present disclosure.

FIG. 4 generally illustrates a pulse-amplitude module (PAM) implementation system 400 according to the principles of the present disclosure. The system 400 is configured to implement PAM, such as PAM 4, PAM8, PAM16, and the like, on the storage system 102. The system 400 include a controller, such as the controller 104, at least one transmission line 402-1 to 402-N (e.g., any suitable number of transmission lines 402 may be included in the system 400), and a plurality of memory dies, such as the memory dies 110-1 to 110-N, as described.

As is illustrated, a group of memory dies of the plurality of memory dies 110-1 to 110-N are connected in parallel (e.g., shorted to) a respective transmission line 402-1 to 402-N. For example, four memory dies (e.g., a first memory die 110-1, a second memory die 110-2, a third memory die 110-3, and a fourth memory die 110-4) may be connected in parallel to a first transmission line 402-1. While four memory dies are illustrated as being connected to the same transmission line, any suitable number of memory dies may be connected to the same transmission line, such as two memory dies, four memory dies, six memory dies, eight memory dies, and so on. Additionally, the system 400 may include any suitable number of memory dies and transmission lines.

Each of the memory dies 110-1 to 110-N includes a driver resistor (e.g., sometimes referred to as on-die termination resistors) that functions to reduce signal noise in data transferred over the transmission lines 402-1 to 402-N (e.g., by impedance matching in the transmission lines 402-1 to 402-N). The controller 104 is configured to set or configure the resistors on each of the memory dies 110-1 to 110-N. For example, the controller 104 may set a first resistor on the first memory die 110-1 to a first resistance value, a second resistor on the second memory die 110-2 to a second resistance value, a third resistor on the third memory die 110-3 to a third resistance value, a fourth resistor on the fourth memory die 110-4 to a fourth resistance value, and so on.

In some embodiments, the controller 104 sets the resistors of the memory dies 110-1 to 110-N to different resistance values. The controller 104 may set the first resistance value of the first resistor may be twice the value of the second resistance value of the second resistor. For example, the first resistance value may be 50 ohms and the second resistance value may be 25 ohm. However, first resistance value and the second resistance value may be set to any suitable resistance value.

In some embodiments, as is illustrated in FIG. 4, the third memory die 110-3 and the fourth memory die 110-4 may be connected in parallel to the first memory die 110-1 and the second memory die 110-2, through the transmission line 402-1. The controller 104 may set resistors of memory dies connected to the same transmission line to different resistance values. For example, the controller 104 may set the third resistor to a resistance value different from the first resistance value and the second resistance value. The controller 104 may set the fourth resistor to a resistance value different from the first resistance value, the second resistance value, and the third resistance value. In some embodiments, the controller 104 may set the third resistor to the same resistance value as the first resistor and the fourth resistor to the same resistance value as the second resistor.

When the controller 104 performs a read operation on at least some of the memory cells of the memory dies 110-1 to 110-N, such as on memory cells of the memory dies 110-1 to 110-4, the memory dies 110-1 to 11-4 transfer or transmit voltage values to the controller 104 via the transmission line 402-1. For example, the first memory die 110-1, during performance of the read operation, transfers two voltage values during a first clock cycle of a clock associated with the memory dies 110-1 to 110-N and the second memory die 110-2, during performance of the read operation, transfers two voltage values during the first clock cycle of the clock (e.g., all memory dies connected to the same transmission line transfer voltage values in parallel).

The controller 104 includes a plurality of PAM receivers 404-1 to 404-N (e.g., corresponding to the number of transmission lines 402-1 to 402-N included in the system 400). The PAM receiver 404-1 may be configured to receive the voltage values transferred from the first memory die 110-1 and the second memory die 110-2. The PAM receiver 404-1 is configured to determine a first data bit using the two voltage values from the first memory die 110-1 and the first resistance value and to determine a second data bit using the two voltage values from the second memory die 110-2 and the second resistance value (e.g., the PAM receiver 404-1 is configured to determine the two data bits transferred from the first memory die 110-1 and the second memory die 110-2). For example, the PAM receiver 404-1 is configured to implement PAM communications format to distinguish between the voltage values from the first memory die 110-1 using the first resistance value from the voltage values from the second memory die 110-2 using the second resistance value. The PAM receiver 404-1 may then determine the first data bit using the two voltage values from the first memory die 110-1 and the second data bit using the two voltage values from the second memory die 110-2.

In some embodiments, the third memory die 110-3, during performance of the read operation, transfers two voltage values during the first clock cycle and the fourth memory die 110-4, during performance of the read operation, transfers two voltage values during the first clock cycle. The PAM receiver 404-1 is configured to receive voltage values from each of the memory dies 110-1 to 110-4. The PAM receiver 404-1 may then distinguish voltage values from respective ones of the memory dies 110-1 to 110-4 using corresponding resistance values (e.g., the first, second, third, and fourth resistance values, respectively).

In some embodiments, as described, the memory dies 110-1 to 110-N are synchronized to the same clock phase of the clock associated with the memory dies 110-1 to 110-N.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 5:
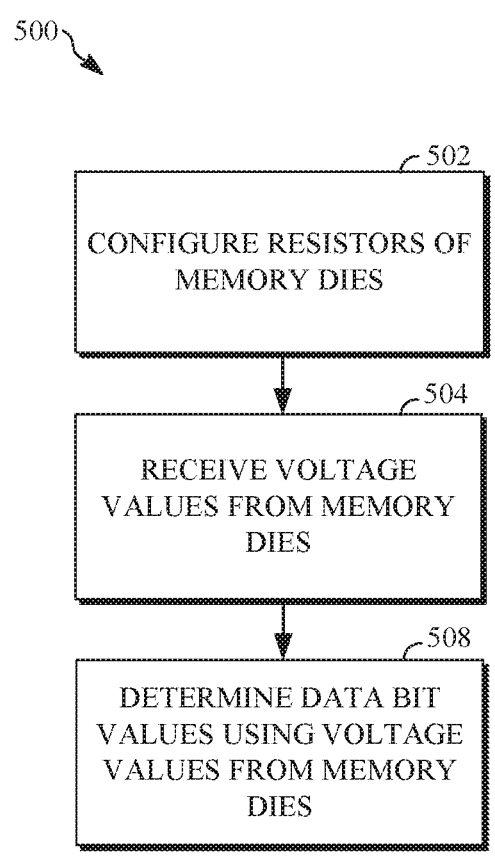
FIG. 5 is a flow diagram generally illustrating a pulse-amplitude modulation implementation method according to the principles of the present disclosure.

FIG. 5 is a flow diagram illustrating a pulse-amplitude modulation implementation method 500 according to the principles of the present disclosure. At 502, the method 500 configured resistors of the memory dies. For example, the controller 104 configured the first resistor of the first memory die 110-1 to the first resistance value and the second resistor of the second memory die 110-2 to the second resistance value. In some embodiments, the controller 104 may configure the third resistor of the third memory die 110-3 to the third resistance value, the fourth resistor of the fourth memory die 110-4 to the fourth resistance value, and any other suitable resistor of any other suitable memory die to any suitable resistance value.

At 504, the method 500 receives voltage values from the memory dies. For example, the PAM receiver 404-1 receives, via the transmission line 402-1, two voltage values from each of the first memory die 110-1 and the second memory die 110-2. In some embodiments, the PAM receive 404-1 receives two voltage values from any suitable number of other memory dies, as described. At 506, the method 500 determines data bit values using voltage values from the memory dies. For example, the PAM receiver 404-1 of the controller 104 determines a first data bit value corresponding to the first data bit using the two voltages from the first memory die 110-1. The PAM receiver 404-1 determines a second data bit value corresponding to the second data bit using the two voltages from the second memory die 110-2. The PAM receiver 404-1 may determine other data bit values corresponding to other data bits using two corresponding voltage values from respective memory dies.

In some embodiments, a method for implementing pulse-amplitude modulation on a memory device includes configuring a first resistor of a first memory die to a first resistance value. The method also includes configuring a second resistor of a second memory die to a second resistance value. The method also includes receiving, during performance of a read operation, in parallel: two voltage values from the first memory die; and two voltage values from the second memory die. The method also includes determining a first data bit value using the two voltage values from the first memory die. The method also includes determining a second data bit value using the two voltage values from the second memory die.

In some embodiments, the first resistance value is greater than the second resistance value. In some embodiments, the first resistance value is twice the value of the second resistance value. In some embodiments, the method also includes configuring a third resistor of a third memory die to a third resistance value; configuring a fourth resistor of a fourth memory die to a fourth resistance value, wherein the third resistance value is greater than the fourth resistance value; and receiving, during performance of the read operation, in parallel, two voltage values from the third memory die and two voltage values from the fourth memory die. In some embodiments, the method also includes determining a third data bit value using the two voltage values from the third memory die and determining a fourth data bit value using the two voltage values from the fourth memory die. In some embodiments, the third memory die and the fourth memory die are shorted to the first memory die and the second memory die. In some embodiments, the first memory die and the second memory die are synchronized to the same clock phase.

In some embodiments, a controller includes a bus interface and a processor. The bus interface is in communication with one or more memory dies of a memory system. The processor is configured to: configure a first resistor of a first memory die to a first resistance value; configure a second resistor of a second memory die to a second resistance value; receive, during performance of a read operation, in parallel, two voltage values from the first memory die and two voltage values from the second memory die; determine a first data bit value using the two voltage values from the first memory die; and determine a second data bit value using the two voltage values from the second memory die.

In some embodiments, the first resistance value is greater than the second resistance value. In some embodiments, the first resistance value is twice the value of the second resistance value. In some embodiments, the processor is further configured to: configure a third resistor of a third memory die to a third resistance value; configure a fourth resistor of a fourth memory die to a fourth resistance value, wherein the third resistance value is greater than the fourth resistance value; and receive, during performance of the read operation, in parallel, two voltage values from the third memory die and two voltage values from the fourth memory die. In some embodiments, the processor is further configured to determine a third data bit value using the two voltage values from the third memory die and determine a fourth data bit value using the two voltage values from the fourth memory die. In some embodiments, the third memory die and the fourth memory die are shorted to the first memory die and the second memory die. In some embodiments, the first memory die and the second memory die are synchronized to the same clock phase.

In some embodiments, a system for implementing pulse-amplitude modulation on a memory system includes a plurality memory dies and a controller. The plurality of memory dies are shorted to a transmission line. The controller is in communication with the transmission line and configured to configure a resistor for each memory die of the plurality of memory dies to a respective resistance value. The controller includes at least one pulse-amplitude modulation receiver configured to: receive, during performance of a read operation, in parallel, two voltage values from each memory die of the plurality of memory dies; and determine a data bit value for each memory die of the plurality of memory dies using the two voltage values corresponding to each respective memory die.

In some embodiments, the plurality of memory dies includes two memory dies. In some embodiments, the plurality of memory dies includes four memory dies. In some embodiments, the plurality of memory dies includes eight memory dies. In some embodiments, each of the resistance values is different from each of the other resistance values. In some embodiments, the plurality of memory dies are synchronized to the same clock phase.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for implementing pulse-amplitude modulation on a memory device, the method comprising:
    configuring a first resistor of a first memory die to a first resistance value;
    configuring a second resistor of a second memory die to a second resistance value;
    receiving, during performance of a read operation, in parallel:
        two voltage values from the first memory die; and
        two voltage values from the second memory die;
    determining a first data bit value using the two voltage values from the first memory die; and
    determining a second data bit value using the two voltage values from the second memory die.

2. The method of claim 1, wherein the first resistance value is greater than the second resistance value.

3. The method of claim 1, wherein the first resistance value is twice the value of the second resistance value.

4. The method of claim 1, further comprising:
    configuring a third resistor of a third memory die to a third resistance value;
    configuring a fourth resistor of a fourth memory die to a fourth resistance value, wherein the third resistance value is greater than the fourth resistance value; and
    receiving, during performance of the read operation, in parallel:
        two voltage values from the third memory die; and
        two voltage values from the fourth memory die.

5. The method of claim 4, further comprising, determining a third data bit value using the two voltage values from the third memory die and determining a fourth data bit value using the two voltage values from the fourth memory die.

6. The method of claim 4, wherein the third memory die and the fourth memory die are shorted to the first memory die and the second memory die.

7. The method of claim 1, wherein the first memory die and the second memory die are synchronized to the same clock phase.

8. A controller comprising:
    a bus interface in communication with one or more memory dies of a memory system; and
    a processor configured to:
        configure a first resistor of a first memory die to a first resistance value;
        configure a second resistor of a second memory die to a second resistance value;
        receive, during performance of a read operation, in parallel:
            two voltage values from the first memory die; and
            two voltage values from the second memory die;
        determine a first data bit value using the two voltage values from the first memory die; and
        determine a second data bit value using the two voltage values from the second memory die.

9. The controller of claim 8, wherein the first resistance value is greater than the second resistance value.

10. The controller of claim 8, wherein the first resistance value is twice the value of the second resistance value.

11. The controller of claim 8, wherein the processor is further configured to:
    configure a third resistor of a third memory die to a third resistance value;
    configure a fourth resistor of a fourth memory die to a fourth resistance value, wherein the third resistance value is greater than the fourth resistance value; and receive, during performance of the read operation, in parallel:
  two voltage values from the third memory die; and
  two voltage values from the fourth memory die.

12. The controller of claim 11, wherein the processor is further configured to determine a third data bit value using the two voltage values from the third memory die and determine a fourth data bit value using the two voltage values from the fourth memory die.

13. The controller of claim 11, wherein the third memory die and the fourth memory die are shorted to the first memory die and the second memory die.

14. The controller of claim 8, wherein the first memory die and the second memory die are synchronized to the same clock phase.

15. A system for implementing pulse-amplitude modulation on a memory system, the system comprising:
  a plurality memory dies shorted to a transmission line; and
  a controller in communication with the transmission line and configured to configure a resistor for each memory die of the plurality of memory dies to a respective resistance value, the controller including at least one pulse-amplitude modulation receive configured to:
    receive, during performance of a read operation, in parallel, two voltage values from each memory die of the plurality of memory dies; and
    determine a data bit value for each memory die of the plurality of memory dies using the two voltage values corresponding to each respective memory die.

16. The system of claim 15, wherein the plurality of memory dies includes two memory dies.

17. The system of claim 15, wherein the plurality of memory dies includes four memory dies.

18. The system of claim 15, wherein the plurality of memory dies includes eight memory dies.

19. The system of claim 15, wherein each of the resistance values is different from each of the other resistance values.

20. The system of claim 15, wherein the plurality of memory dies are synchronized to the same clock phase.

* * * * *